(12) United States Patent
Li et al.

(10) Patent No.: US 9,419,095 B2
(45) Date of Patent: Aug. 16, 2016

(54) METHOD FOR MANUFACTURING DUMMY GATE IN GATE-LAST PROCESS AND DUMMY GATE IN GATE-LAST PROCESS

(71) Applicants: Chunlong Li, Beijing (CN); Junfeng Li, Beijing (CN); Jiang Yan, Newburgh, NY (US); Chao Zhao, Kessel-lo (BE)

(72) Inventors: Chunlong Li, Beijing (CN); Junfeng Li, Beijing (CN); Jiang Yan, Newburgh, NY (US); Chao Zhao, Kessel-lo (BE)

(73) Assignee: INSTITUTE OF MICROELECTRONICS, CHINESE ACADEMY OF SCIENCES, Beijing (CN)

( * ) Notice: Subject to any disclaimer, the term of this patent is extended or adjusted under 35 U.S.C. 154(b) by 76 days.

(21) Appl. No.: 14/119,864

(22) PCT Filed: Dec. 12, 2012

(86) PCT No.: PCT/CN2012/086397
§ 371 (c)(1),
(2) Date: Nov. 23, 2013

(87) PCT Pub. No.: WO2014/086052
PCT Pub. Date: Jun. 12, 2014

(65) Prior Publication Data
US 2015/0035087 A1    Feb. 5, 2015

(30) Foreign Application Priority Data
Dec. 3, 2012  (CN) .......................... 2012 1 0509428

(51) Int. Cl.
*H01L 21/338* (2006.01)
*H01L 29/66* (2006.01)
(Continued)

(52) U.S. Cl.
CPC .... *H01L 29/66545* (2013.01); *H01L 21/28123* (2013.01); *H01L 29/42364* (2013.01); *H01L 29/513* (2013.01); *H01L 29/518* (2013.01)

(58) Field of Classification Search
CPC ................... H01L 29/66545; H01L 21/28123
USPC ................................. 438/257, 264
See application file for complete search history.

(56) References Cited

U.S. PATENT DOCUMENTS 6,933,226 B2    8/2005  Lee
7,576,386 B2    8/2009  Lue
(Continued)

FOREIGN PATENT DOCUMENTS

CN         1531018 A       9/2004
CN       101211770 A       7/2008
(Continued)

OTHER PUBLICATIONS

English Translation of CN 101236899 A provided by EPO, Aug. 2008.*

(Continued)

*Primary Examiner* — Stephen Bradley
(74) *Attorney, Agent, or Firm* — Goodwin

(57) ABSTRACT

A method for manufacturing a dummy gate in a gate-last process and a dummy gate in a gate-last process are provided. The method includes: providing a semiconductor substrate; growing a gate oxide layer on the semiconductor substrate; depositing bottom-layer amorphous silicon on the gate oxide layer; depositing an ONO structured hard mask on the bottom-layer amorphous silicon; depositing top-layer amorphous silicon on the ONO structured hard mask; depositing a hard mask layer on the top-layer amorphous silicon; forming photoresist lines on the hard mask layer, and trimming the formed photoresist lines so that the trimmed photoresist lines a width less than or equal to 22 nm; and etching the hard mask layer, the top-layer amorphous silicon, the ONO structured hard mask and the bottom-layer amorphous silicon in accordance with the trimmed photoresist lines, and removing the photoresist lines, the hard mask layer and the top-layer amorphous silicon.

7 Claims, 10 Drawing Sheets

(51) Int. Cl.
*H01L 29/423* (2006.01)
*H01L 29/51* (2006.01)
*H01L 21/28* (2006.01)

(56) References Cited

U.S. PATENT DOCUMENTS

| | | |
|---|---|---|
| 7,700,472 B2 | 4/2010 | Kim |
| 7,919,370 B2 * | 4/2011 | Lim ........................ 438/257 |
| 7,947,585 B2 * | 5/2011 | Baek et al. ................ 438/559 |
| 8,049,286 B2 * | 11/2011 | Tateshita .................. 257/401 |
| 8,157,468 B2 * | 4/2012 | Lynn et al. ................ 403/152 |
| 8,158,468 B2 * | 4/2012 | Masuoka et al. .......... 438/152 |
| 8,222,154 B2 * | 7/2012 | Doris et al. ............... 438/705 |
| 2002/0076867 A1 | 6/2002 | Lee |
| 2004/0150032 A1 * | 8/2004 | Wu .......................... 257/315 |
| 2005/0118531 A1 | 6/2005 | Lee |
| 2007/0029625 A1 | 2/2007 | Lue |
| 2007/0173018 A1 * | 7/2007 | Aritome .................... 438/257 |
| 2008/0157177 A1 | 7/2008 | Lim |
| 2008/0160747 A1 | 7/2008 | Kim |
| 2009/0130836 A1 | 5/2009 | Sun |
| 2011/0136312 A1 * | 6/2011 | Hashimoto et al. ........... 438/287 |
| 2011/0306189 A1 * | 12/2011 | Cheng et al. ................ 438/488 |

FOREIGN PATENT DOCUMENTS

| | | | |
|---|---|---|---|
| CN | 101236899 A | * | 8/2008 |
| CN | 1929094 A | | 3/2009 |
| CN | 101436545 A | | 9/2009 |
| CN | 102543696 A | | 7/2012 |
| CN | 102544089 A | | 7/2012 |

OTHER PUBLICATIONS

PCT International Search Report issued in PCT/CN2012/086397.
PCT Written Opinion issued in PCT/CN2012/086397.
PCT International Search Report issued in PCT/CN2012/086398.
PCT Written Opinion issued in PCT/CN2012/086398.
PCT International Search Report issued in PCT/CN2012/086401.
PCT Written Opinion issued in PCT/CN2012/086401.

* cited by examiner

ND DUMMY GATE IN GATE-LAST PROCESS

METHOD FOR MANUFACTURING DUMMY GATE IN GATE-LAST PROCESS AND DUMMY GATE IN GATE-LAST PROCESS

CROSS-REFERENCE OF RELATED APPLICATIONS

This application is the U.S. national phase of International Application No. PCT/CN2012/086397, filed on Dec. 12, 2012 and titled "METHOD FOR MANUFACTURING DUMMY GATE IN GATE-LAST PROCESS AND DUMMY GATE IN GATE-LAST PROCESS", which claimed priority to Chinese application No. 201210509428.X filed on Dec. 3, 2012, which is incorporated herein by reference in its entirety.

FIELD OF THE INVENTION

The present invention relates to the field of semiconductor technologies, and in particular to a method for manufacturing a dummy gate in a gate-last process as well as a dummy gate in a gate-last process.

BACKGROUND OF THE INVENTION

With the continuous development in IC (integrated circuit) manufacturing technology, the feature size of a MOSFET (metal-oxide-semiconductor field-effect transistor) continuously shrinks. In order to reduce parasitic capacitance on the gate electrode of a MOSFET and increase device speed, a gate stack structure that includes a high-K (high dielectric constant) gate dielectric layer and a metal gate electrode is introduced to the MOSFET. In order to prevent the metal material of the metal gate electrode from affecting the other structures of the transistor, the gate stack structure including a metal gate electrode and a high-K gate dielectric layer is generally manufactured by a gate-last process.

The gate-last process includes: providing a semiconductor substrate, on which a dummy gate structure and an etch stopping layer covering the dummy gate structure are provided; forming an interlayer dielectric layer on the surface of the etch stopping layer; performing CMP (chemical-mechanical polishing) on the interlayer dielectric layer and the etch stopping layer by using the surface of the dummy gate structure as a stopping layer; removing the dummy gate structure to form a trench; filling in the trench with metal by PVD (physical vapor deposition) or sputtering the metal from a target to the trench, to form a metal gate electrode layer; and polishing the metal gate electrode layer by CMP until the interlayer dielectric layer is exposed, thereby a metal gate is formed.

Accordingly, in the gate-last process, the manufacture of the dummy gate is crucial. However, currently, due to the limitations in physical mechanism, processing technology, manufacturing techniques, etc., the critical dimension of the dummy gate and the profile of the dummy gate cannot be accurately controlled at the 22 nm node and beyond, which degrades gate LER (Line Edge Roughness), device performance and device reliability.

SUMMARY OF THE INVENTION

In view of the above, an embodiment of the present disclosure provides a method for manufacturing a dummy gate in a gate-last process. The method includes:
providing a semiconductor substrate;
growing a gate oxide layer on the semiconductor substrate;
depositing bottom-layer amorphous silicon ($\alpha$-Si) on the gate oxide layer;
depositing an oxide-nitride-oxide (ONO) structured hard mask on the bottom-layer $\alpha$-Si;
depositing top-layer $\alpha$-Si on the ONO structured hard mask;
depositing a hard mask layer on the top-layer $\alpha$-Si;
forming photoresist lines on the hard mask layer, and trimming the formed photoresist lines so that the trimmed photoresist lines a width less than or equal to 22 nm; and
etching the hard mask layer, the top-layer $\alpha$-Si, the ONO structured hard mask and the bottom-layer $\alpha$-Si in accordance with the trimmed photoresist lines, and removing the hard mask layer and the top-layer $\alpha$-Si.

Preferably, the etching the hard mask layer, the top-layer $\alpha$-Si, the ONO structured hard mask and the bottom-layer $\alpha$-Si in accordance with the trimmed photoresist lines, and removing the trimmed photoresist lines, the hard mask layer and the top-layer $\alpha$-Si may include:
etching the hard mask layer by using the trimmed photoresist lines as a mask for the hard mask layer, and removing the photoresist lines;
etching the top-layer $\alpha$-Si by using the hard mask layer as a mask for the top-layer $\alpha$-Si;
etching the ONO structured hard mask by using the hard mask layer and the top-layer $\alpha$-Si as a mask for the ONO structured hard mask, and removing the hard mask layer; and
etching the bottom-layer $\alpha$-Si by using the top-layer $\alpha$-Si and the ONO structured hard mask as a mask for the bottom-layer $\alpha$-Si, and removing the top-layer $\alpha$-Si.

Preferably, the depositing bottom-layer $\alpha$-Si on the gate oxide layer may include:
depositing the bottom-layer $\alpha$-Si on the gate oxide layer by low-pressure chemical vapor deposition (LPCVD).

Preferably, the bottom-layer $\alpha$-Si may have a thickness ranging from 600 Å to 1200 Å.

Preferably, the depositing an ONO structured hard mask on the bottom-layer $\alpha$-Si may include:
depositing a bottom oxide film on the bottom-layer $\alpha$-Si by plasma-enhanced chemical vapor deposition (PECVD);
depositing a nitride film on the bottom oxide film by low-pressure chemical vapor deposition (LPCVD); and
depositing a top oxide film on the nitride film by atmospheric pressure chemical vapor deposition (APCVD).

Preferably, the bottom oxide film may have a thickness ranging from 80 Å to 120 Å, the nitride film may have a thickness ranging from 160 Å to 240 Å, and the top oxide film may have a thickness ranging from 500 Å to 800 Å.

Preferably, the depositing the top-layer $\alpha$-Si and the hard mask layer on the ONO structured hard mask may include:
depositing the top-layer $\alpha$-si on the ONO structured hard mask by low-pressure chemical vapor deposition (LPCVD); and
depositing the hard mask layer on the top-layer $\alpha$-Si by plasma-enhanced chemical vapor deposition (PECVD).

Preferably, the top-layer $\alpha$-Si may have a thickness ranging from 300 Å to 400 Å, and the hard mask layer may have a thickness ranging from 300 Å to 400 Å.

Another embodiment of the present disclosure provides a dummy gate in a gate-last process, including: a semiconductor substrate, a gate oxide layer on a surface of the semiconductor substrate, an amorphous silicon ($\alpha$-Si) layer on a surface of the gate oxide layer, and an oxide-nitride-oxide (ONO) structured hard mask on the $\alpha$-Si layer, wherein the $\alpha$-Si layer and the ONO structured hard mask each have a width less than or equal to 22 nm.

Preferably, the ONO structured hard mask may include a bottom oxide film, a nitride film and a top oxide film.

According to the method for manufacturing a dummy gate in a gate-last process provided by an embodiment of the present disclosure, the ONO structured hard mask is deposited on the α-Si; then in the etching stage the photoresist lines are trimmed so that the width of the photoresist lines is less than or equal to 22 nm; and the ONO structured hard mask is etched in accordance with the width. By using this method, at the 22 nm node and beyond, the critical dimension of the dummy gate and the profile of the dummy gate can be accurately controlled, and the gate LER can be effectively improved, thereby ensuring device performance and device reliability.

BRIEF DESCRIPTION OF THE DRAWINGS

The accompany drawings used in the description of the embodiments and the prior art are briefly described as follows, allowing a more detailed description of the technical solutions provided by the embodiments of the present disclosure and the prior art. Clearly, the accompany drawings described below are merely some of the embodiments of the present disclosure; for those skilled in the art, other drawings can be obtained based on these accompany drawings without inventive effort.

FIG. 2-1 to FIG. 2-10 are structural diagrams illustrating the stages in manufacturing a dummy gate in a gate-last process by using the method as shown in FIG. 1 according to the embodiment of the present disclosure.

REFERENCE NUMERALS

20—semiconductor substrate, 22—gate oxide, 24—bottom-layer α-Si, 26—ONO structured hard mask, 28—top-layer α-Si, 30—hard mask layer, 32—photoresist line; 261—bottom oxide film, 262—nitride film, 263—top oxide film.

DETAILED DESCRIPTION OF THE EMBODIMENTS

For a better understanding of the technical solutions of the application by those skilled in the art, the technical solutions provided by the embodiments of the present disclosure will be described hereinafter in conjunction with the accompany drawings. It is clear that the embodiments described herein are merely part of the embodiments of the present disclosure. Any other embodiment obtained by those skilled in the art based on the embodiments described herein without inventive effort falls within the scope of protection of the present disclosure.

An embodiment of the present disclosure provides a method for manufacturing a dummy gate in a gate-last process. The method includes: providing a semiconductor substrate; growing a gate oxide layer on the semiconductor substrate; depositing bottom-layer α-Si on the gate oxide layer; depositing an ONO structured hard mask on the bottom-layer α-Si; depositing top-layer α-Si on the ONO structured hard mask; depositing a hard mask layer on the top-layer α-Si; forming photoresist lines on the hard mask layer, and trimming the formed photoresist lines so that the trimmed photoresist lines has a width less than or equal to 22 nm; and etching the hard mask layer, the top-layer α-Si, the ONO structured hard mask and the bottom-layer α-Si in accordance with the trimmed photoresist lines, and removing the photoresist lines, the hard mask layer and the top-layer α-Si.

In the method above for manufacturing a dummy gate in a gate-last process, the ONO structured hard mask is deposited on the α-Si; then in the etching stage the photoresist lines are trimmed so that the width of the photoresist lines is less than or equal to 22 nm; and the ONO structured hard mask is etched in accordance with the width. By using this method, at the 22 nm node and beyond, the critical dimension of the dummy gate and the profile of the dummy gate can be accurately controlled, and the gate LER can be effectively improved, thereby ensuring device performance and device reliability.

The above objects, features and advantages of the present disclosure will become more apparent when read in conjunction with the accompanying drawings and the following description of the embodiments of the present disclosure. In the detailed description of the embodiments of the present disclosure, for illustrative purposes, the section views illustrating the structure of a device are not drawn to scale. Moreover, the drawings are merely exemplary, and shall not be interpreted as limiting the scope of protection of the present disclosure. Furthermore, in an actual manufacture process, the three dimensions including length, width and depth should be included.

Figure 1:
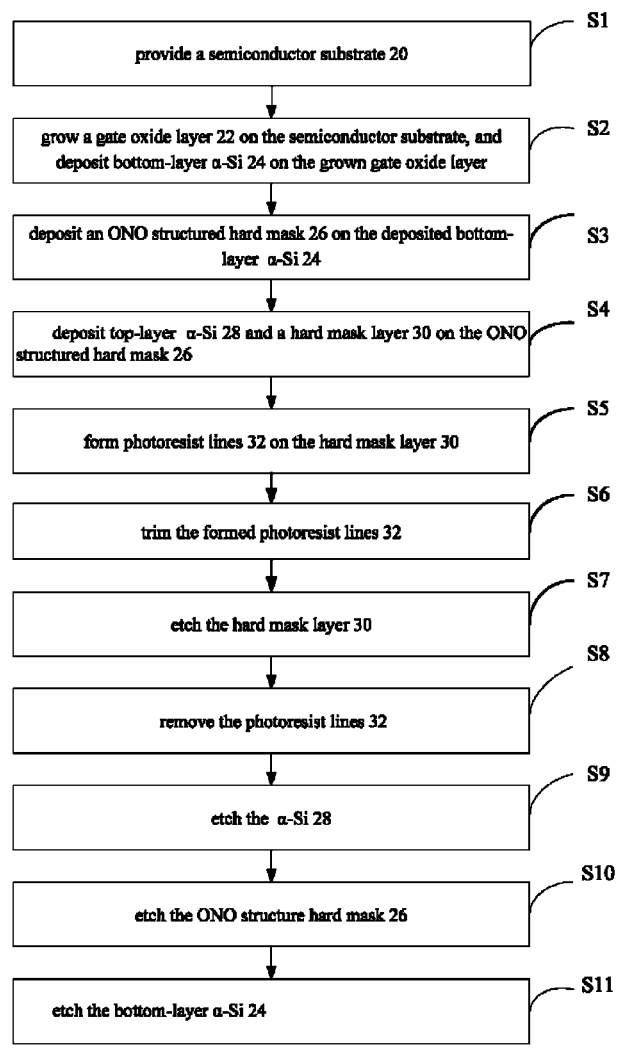
FIG. 1 is a flowchart illustrating a method for manufacturing a dummy gate in a gate-last process according to an embodiment of the present disclosure.
Figures 1, 2:
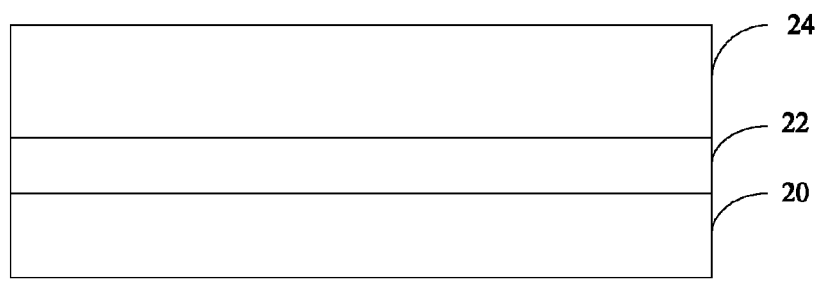
Figure 2:
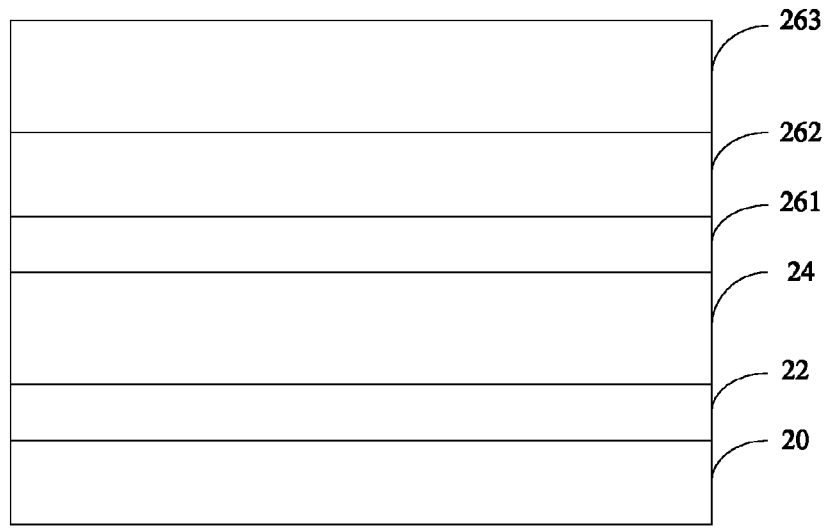
Figures 2, 3:
Figures 2, 3, 4:
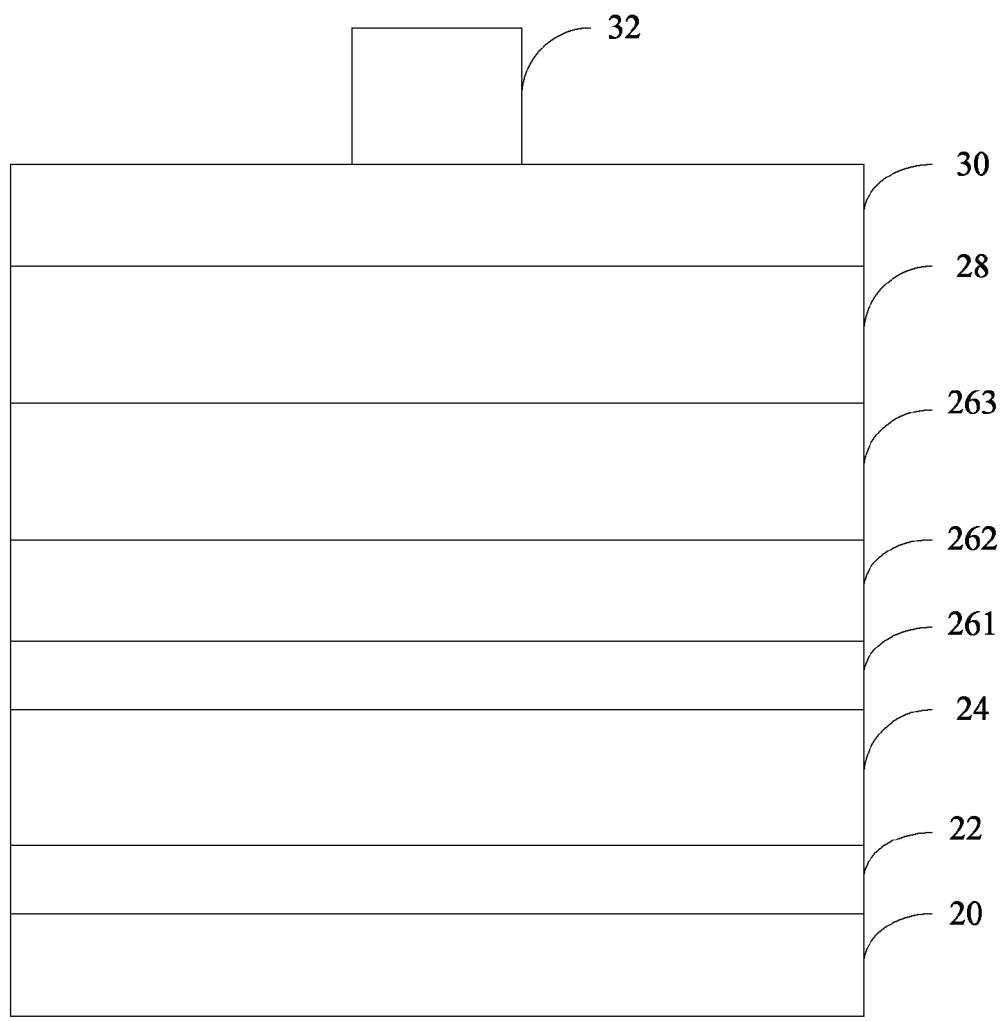
Figures 2, 3, 4, 5:
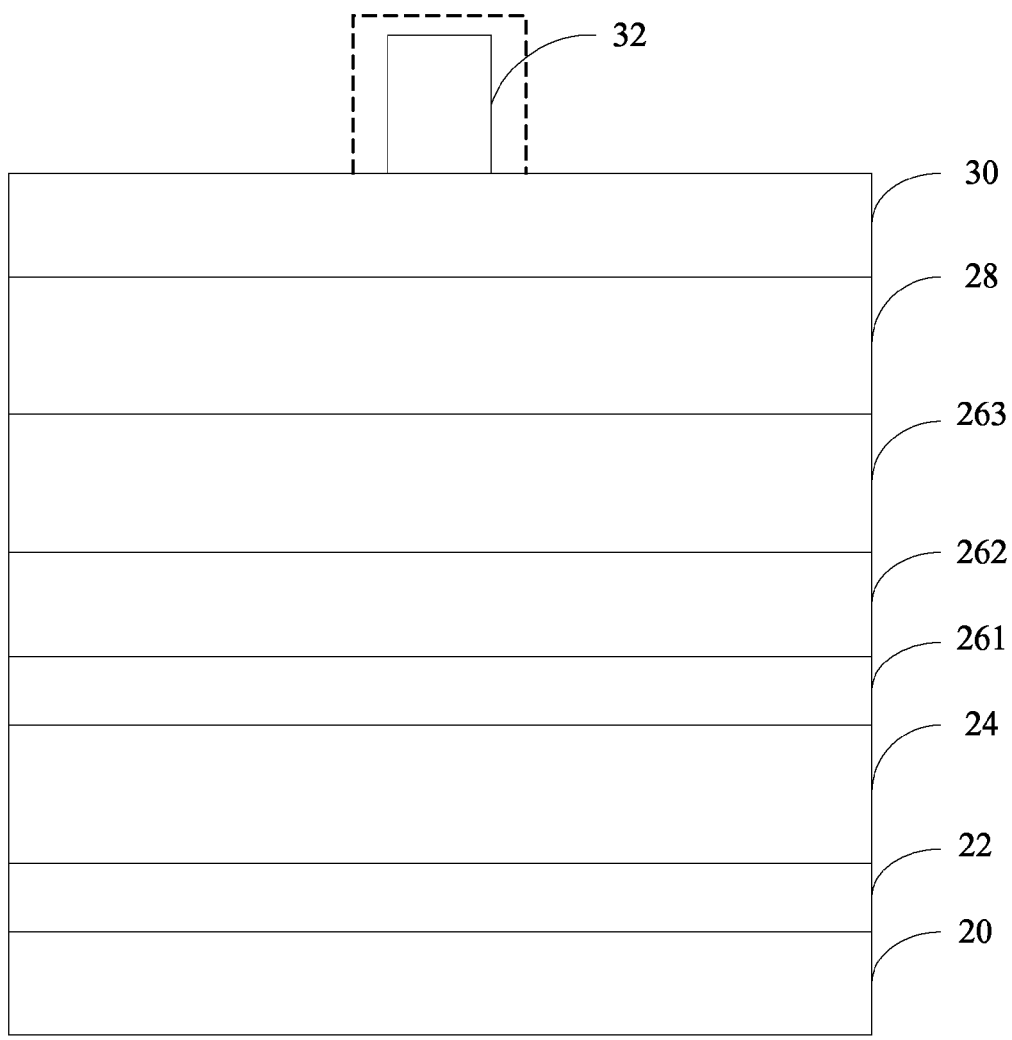
Figures 2, 3, 4, 5, 6:
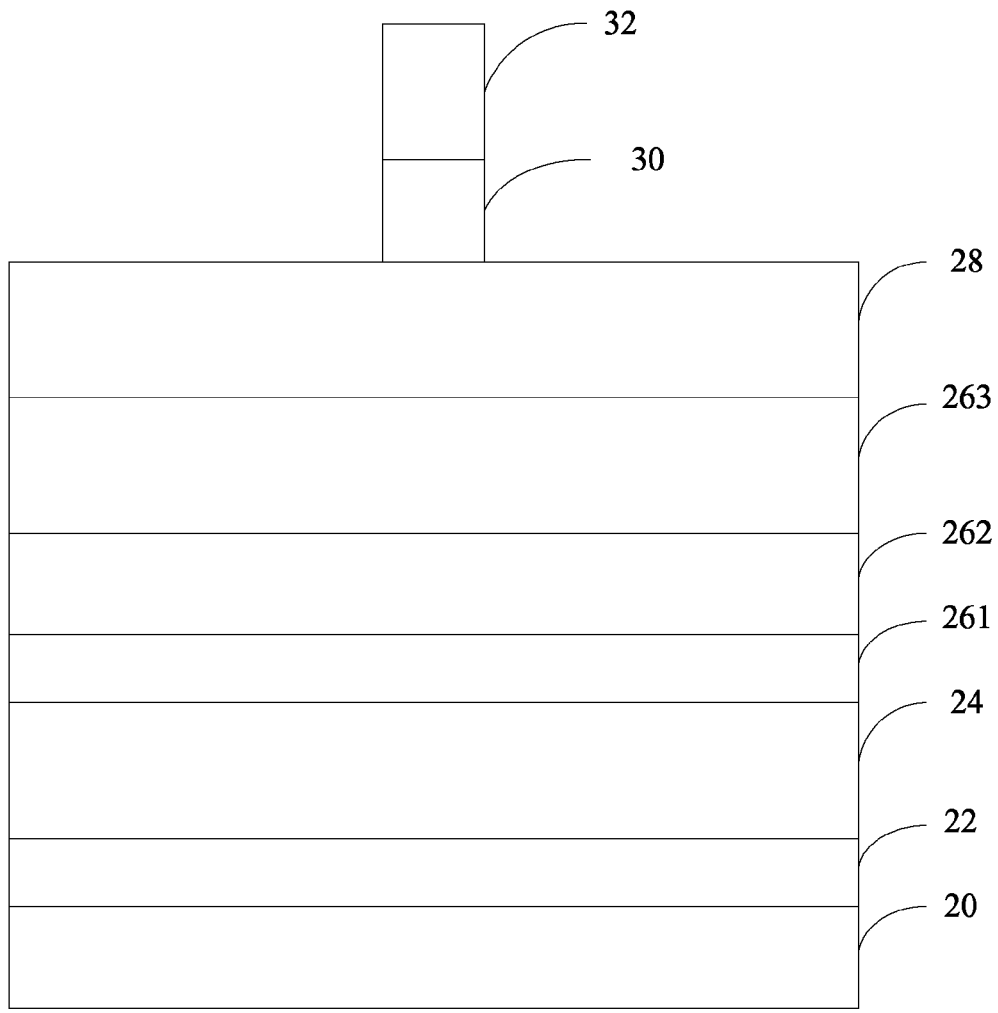
Figures 2, 3, 4, 5, 6, 7:
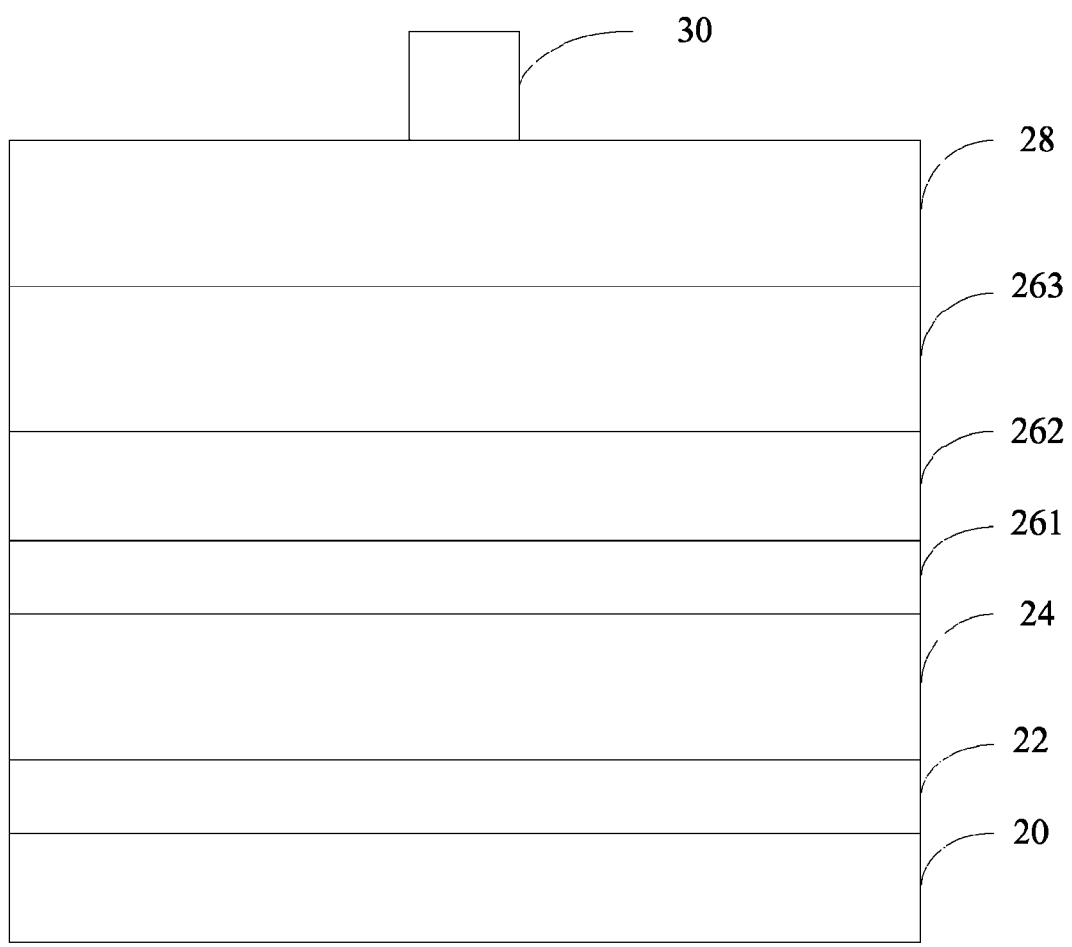
Figures 2, 3, 4, 5, 6, 7, 8:
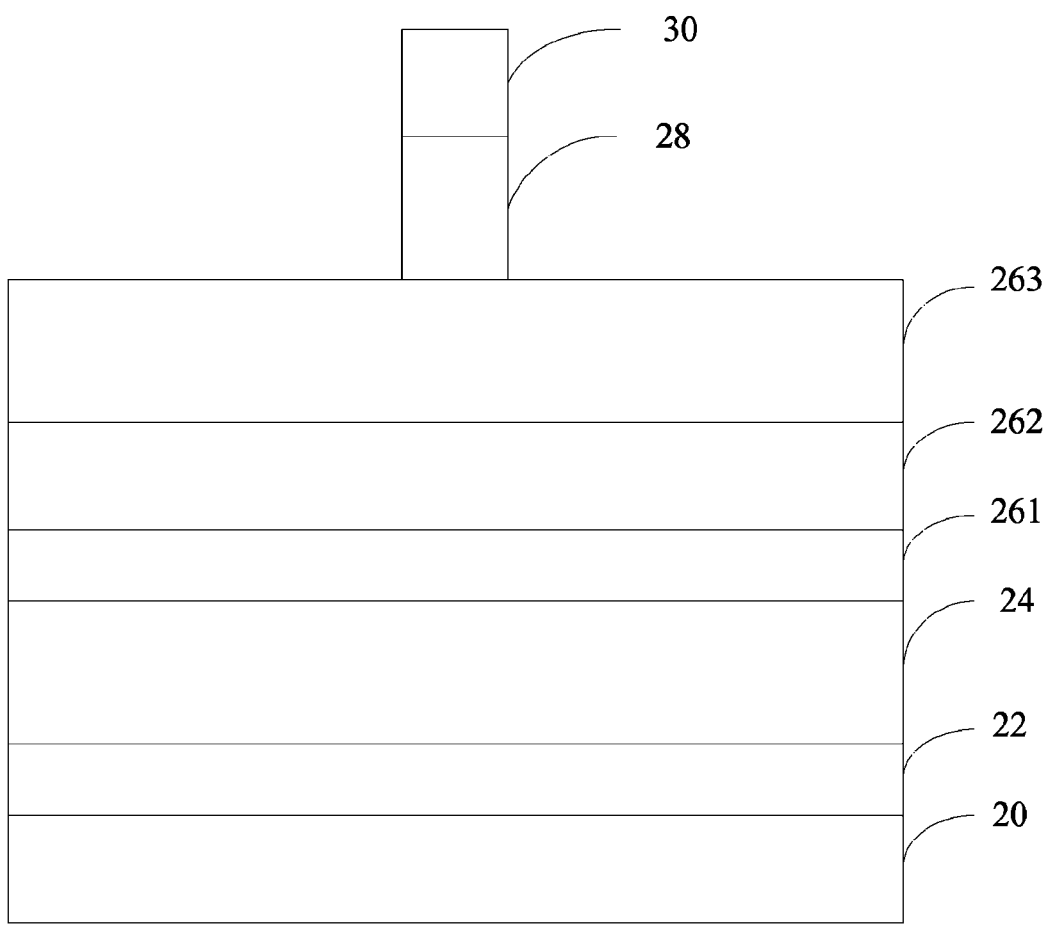
Figures 2, 3, 4, 5, 6, 7, 8, 9:
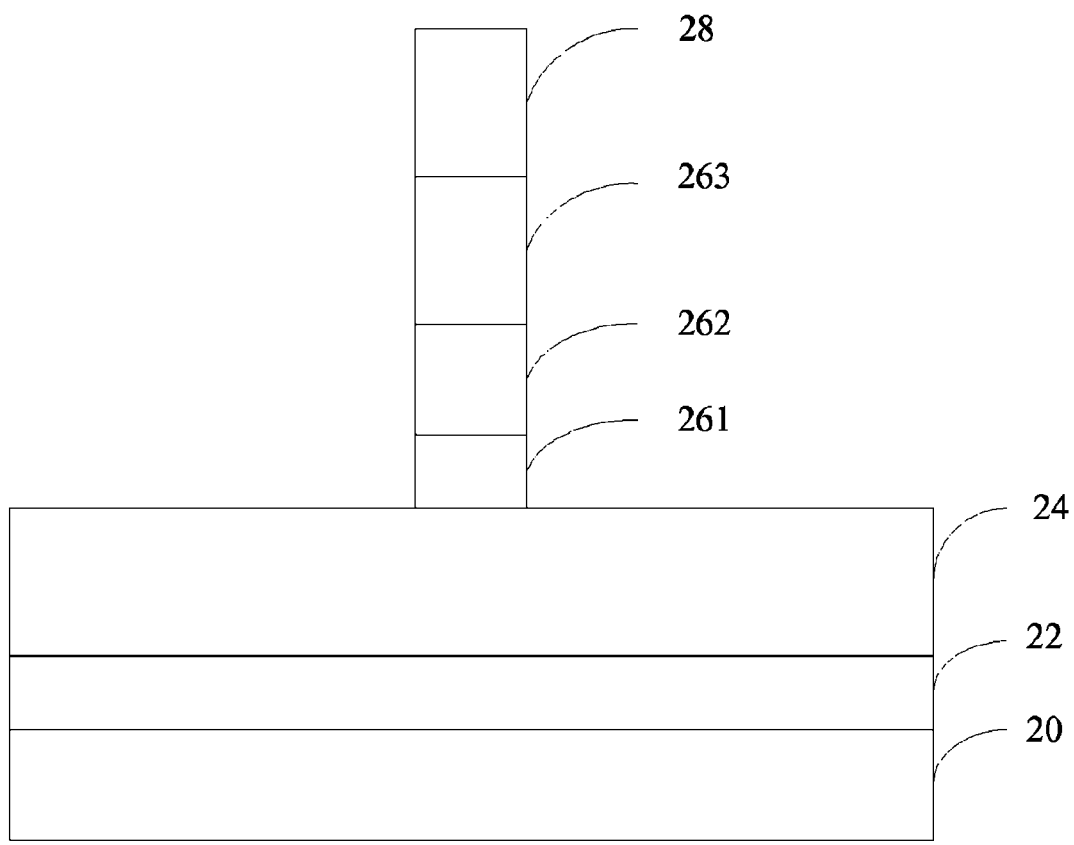
Figures 2, 3, 4, 5, 6, 7, 8, 9, 10:
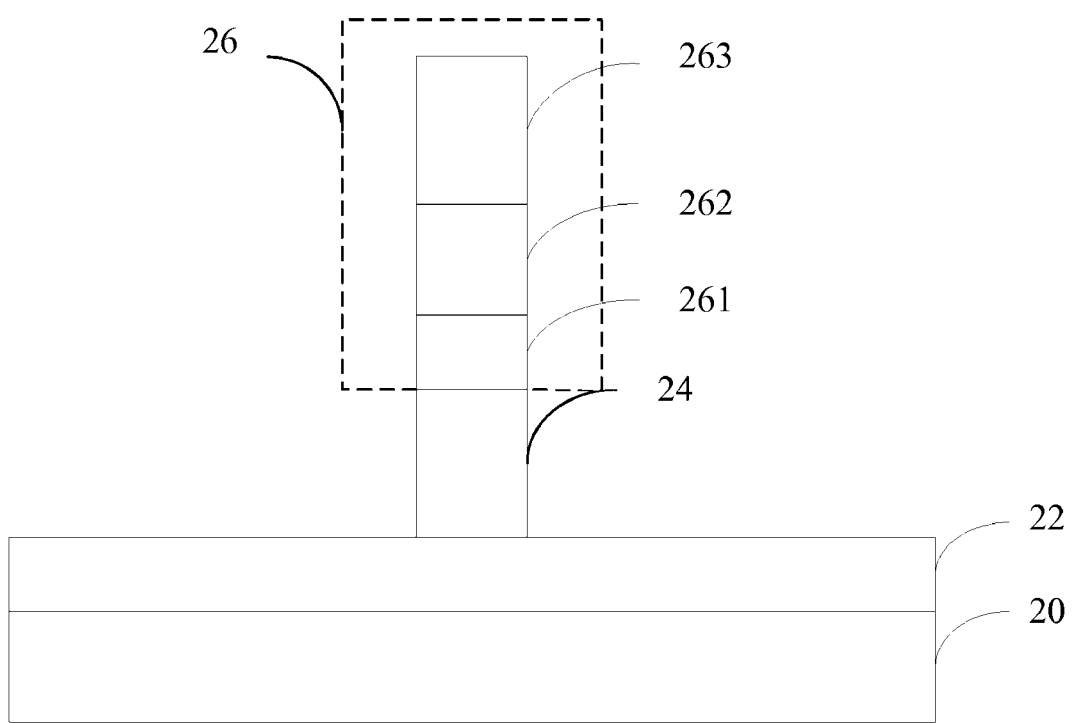

FIG. 1 is a flowchart illustrating a method for manufacturing a dummy gate in a gate-last process according to an embodiment, and FIG. 2-1 to FIG. 2-10 are structural diagrams illustrating the stages in manufacturing a dummy gate in a gate-last process by using the method as shown in FIG. 1 according to the embodiment of the present disclosure.

As shown in FIG. 1, the method for manufacturing a dummy gate in a gate-last process includes the following steps.

Step S1: providing a semiconductor substrate 20.

In this step, the substrate 20 may be of any semiconductor material, e.g., monocrystalline silicon, polycrystalline silicon, amorphous silicon, germanium, silicon-germanium (SiGe), silicon carbide, indium antimonide (InSb), lead telluride (PbTe), indium arsenide (InAs), indium phosphide (InP), gallium arsenide (GaAs) or gallium antimonide (GaSb), an alloy semiconductor, or some other compound semiconductor material. Moreover, the substrate may have a stack structure, e.g., Si/SiGe, silicon on insulator (SOI), or silicon-germanium on insulator (SGOI). In addition, the substrate may be a fin-type device, a normal planar CMOS device, a nanowire device or the like. In the embodiment of the present disclosure, as an example, the material of the substrate 20 is Si. It is noted that this is for illustrative purposes only, and the present disclosure is note limited to this specific example.

Step S2: growing a gate oxide layer 22 on the semiconductor substrate, and depositing bottom-layer α-Si 24 on the grown gate oxide layer.

In this step, a thermal oxidation process may be used for growing the gate oxide layer 22 on the semiconductor substrate 20. Specifically, the thermal oxidation process may be a conventional thermal oxidation process performed in a furnace, an in-situ steam generation (ISSG) process, or a rapid thermal oxidation (RTO) process. The material of the gate oxide layer 22 may be silicon oxide, silicon oxynitride or the like. In addition, the material of the gate oxide layer 22 may also be some other material known by those skilled in the art. The thickness of the gate oxide layer 22 may range from 8 Angstroms (Å) to 40 Å.

Then, the bottom-layer α-Si 24 is deposited on the grown gate oxide layer 22. This may be implemented with a chemical vapor deposition (CVD) process, e.g., LPCVD, APCVD, PECVD, or high-density plasma chemical vapor deposition (HDPCVD). The thickness of the deposited bottom-layer α-Si 24 may range from 600 Å to 1200 Å.

Step S3: depositing an ONO structured hard mask 26 on the deposited bottom-layer α-Si 24.

In this step, the depositing the ONO structured hard mask 26 may include: depositing a bottom oxide film 261, a nitride film 262 and a top oxide film 263 sequentially on the bottom-layer α-Si 24. In the embodiment, the bottom oxide film 261 may be deposited by a PECVD process; the nitride film 262 may be deposited by an LPCVD process or a PECVD process; the top oxide film 263 may be deposited by an APCVD process, an LPCVD process or a PECVD process. Furthermore, the materials of the bottom oxide film 261 and the top oxide film 263 may be silicon oxide, and the thickness of the bottom oxide film 261 may range from 80 Å to 120 Å and the thickness of the top oxide film 263 may range from 500 Å to 800 Å. The material of the nitride film 262 may be silicon nitride, and its thickness may range from 160 Å to 240 Å.

Step S4: depositing top-layer α-Si 28 and a hard mask layer 30 on the ONO structured hard mask 26.

In this step, the top-layer α-Si 28 may be deposited by a CVD process, an APCVD process, a PECVD process, an HDPCVD process or the like. The thickness of the deposited top-layer α-Si 28 may range from 300 Å to 400 Å.

Then, the hard mask layer 30 is deposited on the top-layer α-Si 28. In the embodiment, the hard mask layer 30 may be an oxide film, and may be deposited by a PECVD process. The thickness of the hard mask layer 30 may range from 300 Å to 400 Å.

Step S5: forming photoresist lines 32 on the hard mask layer 30.

In this step, the photoresist lines 32 may be formed by immersion lithography or electron beam direct writing. The present disclosure is not limited to these specific examples. Furthermore, the embodiment imposes no limitation on the width of the formed photoresist lines 32.

Step S6: trimming the formed photeresist line 32.

In this step, in order to form a dummy gate in a gate-last process having a width of 22 nm or less, the formed photoresist lines 32 are trimmed so that the width of the photoresist lines 32 is less than or equal to 22 nm. In the embodiment, the formed photoresist lines 32 may be trimmed in situ by using oxygen plasma. Specifically, oxygen gas is fed into a dry etch apparatus such as a reactive-ion etching (RIE) apparatus, and a radio-frequency power supply is applied to the etching apparatus, so that oxygen plasma is formed, and the photoresist lines 32 are trimmed by using the oxygen plasma.

Step S7: etching the hard mask layer 30.

In this step, the hard mask layer 30 may be etched by a dry etching method using the formed photoresist lines 32 used as a mask. For example, the hard mask layer 30 may be etched by a RIE process.

Step S8: removing the photoresist lines 32.

In this step, a dry photoresist-removing method may be used. For example, the photoresist lines 32 may be removed by using oxygen plasma. Specifically, the photoresist lines 32 may be removed by oxygen plasma filled in a plasma etch chamber. In order to completely remove the photoresist lines 32 and a polymer generated in the etching of the hard mask layer 30, a method incorporating dry photoresist-removing and wet dry photoresist-removing may be used in this step.

Step S9: etching the top-layer α-Si 28.

In this step, the top-layer α-Si 28 is etched by using the hard mask layer 30 as a mask for the top-layer α-Si 28. In the embodiment, the top-layer α-Si 28 may be etched by a RIE process or the like, and the present disclosure is not limited to the specific example.

Step S10: etching the ONO structured hard mask 26.

In this step, the ONO structured hard mask 26 is etched by using the hard mask layer 30 and the top-layer α-Si 28 as a mask. In the embodiment, the ONO structured hard mask 26 may be etched by a RIE process. Moreover, the hard mask layer 30 may be removed after the etching of the ONO structured hard mask 26, which simplifies subsequent processes.

Step S11: etching the bottom-layer α-Si 24.

In this step, the bottom-layer α-Si 24 is etched by using the top-layer α-Si 28 and the ONO structured hard mask 26 as a mask. In the embodiment, the bottom-layer α-Si 24 may be etched by a RIE process. Moreover, the top-layer α-Si 28 may be removed directly after the etching of the bottom-layer α-Si 24.

Thus, a dummy gate in a gate-last process having a line width of 22 nm is manufactured.

In the method for manufacturing a dummy gate in a gate-last process provided by the embodiment of the present disclosure, the ONO structured hard mask is deposited on the α-Si; then in the etching stage the photoresist lines are trimmed so that the width of the photoresist lines is less than or equal to 22 nm; and the ONO structured hard mask is etched in accordance with the width. By using this method, at the 22 nm node and beyond, the critical dimension of the dummy gate and the profile of the dummy gate can be accurately controlled, and the gate LER can be effectively improved, thereby ensuring device performance and device reliability.

Another embodiment of the present disclosure provides a dummy gate structure formed by the method described above. As shown in FIG. 2-10, a section view of the structure of the dummy gate according to the embodiment of the present disclosure, the dummy gate structure includes: a semiconductor substrate 20, a gate oxide layer 22 on a surface of the semiconductor substrate, an α-Si layer 24 on a surface of the gate oxide layer 22, and an ONO structured hard mask 26 on the α-Si layer 24. The widths of the α-Si layer 24 and the ONO structured hard mask 26 are less than or equal to 22 nm.

The ONO structured hard mask 26 includes: a bottom oxide film 261, a nitride film 262 and a top oxide film 263. The materials of the bottom oxide film 261 and the top oxide film 263 may be silicon oxide. The thicknesses of the bottom oxide film 261 may range from 80 Å to 120 Å, and the thickness of the top oxide film 263 may range from 500 Å to 800 Å. The material of the nitride film 262 may be silicon nitride, and its thickness may range from 160 Å to 240 Å.

The description of the embodiments disclosed herein enables those skilled in the art to implement or use the present invention. Various modifications to the embodiments may be apparent to those skilled in the art, and the general principle defined herein can be implemented in other embodiments without deviation from the scope of the present invention. Therefore, the present invention shall not be limited to the embodiments described herein, but in accordance with the widest scope consistent with the principle and novel features disclosed herein.

The invention claimed is:
1. A method for manufacturing a dummy gate in a gate-last process, comprising:
   providing a semiconductor substrate;
   growing a gate oxide layer on the semiconductor substrate;
   depositing bottom-layer amorphous silicon, α-Si, on the gate oxide layer;

depositing an oxide-nitride-oxide, ONO, structured hard mask on the bottom-layer α-Si;

depositing top-layer α-Si on the ONO structured hard mask;

depositing a hard mask layer on the top-layer α-Si;

forming photoresist lines on the hard mask layer, and trimming the formed photoresist lines;

etching the hard mask layer by using the trimmed photoresist lines as a mask for the hard mask layer, and removing the photoresist lines;

etching the top-layer α-Si by using the hard mask layer as a mask for the top-layer α-Si;

etching the ONO structured hard mask by using the hard mask layer and the top-layer α-Si as a mask for the ONO structured hard mask, and removing the hard mask layer before etching the bottom-layer α-Si; and etching the bottom-layer α-Si by using the top-layer α-Si and the ONO structured hard mask as a mask for the bottom-layer α-Si, and removing the top-layer α-Si.

2. The method according to claim 1, wherein the depositing bottom-layer α-Si on the gate oxide layer comprises:

depositing the bottom-layer α-Si on the gate oxide layer by low-pressure chemical vapor deposition.

3. The method according to claim 2, wherein the bottom-layer α-Si has a thickness ranging from 600 Å to 1200 Å.

4. The method according to claim 3, wherein the depositing an ONO structured hard mask on the bottom-layer α-Si comprises:

depositing a bottom oxide film on the bottom-layer α-Si by plasma-enhanced chemical vapor deposition;

depositing a nitride film on the bottom oxide film by low-pressure chemical vapor deposition; and depositing a top oxide film on the nitride film by atmospheric pressure chemical vapor deposition.

5. The method according to claim 4, wherein the bottom oxide film has a thickness ranging from 80 Å to 120 Å, the nitride film has a thickness ranging from 160 Å to 240 Å, and the top oxide film has a thickness ranging from 500 Å to 800 Å.

6. The method according to claim 1, wherein the depositing the top-layer α-Si and the hard mask layer on the ONO structured hard mask comprises:

depositing the top-layer α-Si on the ONO structured hard mask by low-pressure chemical vapor deposition; and depositing the hard mask layer on the top-layer α-Si by plasma-enhanced chemical vapor deposition.

7. The method according to claim 6, wherein the top-layer α-Si has a thickness ranging from 300 Å to 400 Å, and the hard mask layer has a thickness ranging from 300 Å to 400 Å.

* * * * *